(12) United States Patent
Eichorn et al.

(10) Patent No.: US 7,025,640 B2
(45) Date of Patent: Apr. 11, 2006

(54) CIRCUIT BOARD INTER-CONNECTION SYSTEM AND METHOD

(75) Inventors: Daniel S Eichorn, Poland, OH (US); Michael W Allender, Austintown, OH (US); Dominic Anthony Messuri, Canfield, OH (US); Christopher Alan Brandon, Fairhope, AL (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/666,945

(22) Filed: Sep. 19, 2003

(65) Prior Publication Data

US 2004/0092174 A1    May 13, 2004

Related U.S. Application Data

(60) Provisional application No. 60/412,750, filed on Sep. 23, 2002.

(51) Int. Cl.
*H01R 4/02*    (2006.01)

(52) U.S. Cl. .......................... 439/876; 439/83; 29/842
(58) Field of Classification Search ................ 439/876, 439/83, 78, 80, 81, 82; 29/842, 843, 845
See application file for complete search history.

(56) References Cited

U.S. PATENT DOCUMENTS

| | | | | |
|---|---|---|---|---|
| 4,066,326 A | * | 1/1978 | Lovendusky | 439/873 |
| 4,735,587 A | * | 4/1988 | Kirayoglu | 439/751 |
| 4,884,335 A | * | 12/1989 | McCoy et al. | 29/839 |
| 4,968,263 A | | 11/1990 | Silbernagel et al. | 439/246 |
| 5,076,796 A | * | 12/1991 | Kusayanagi et al. | 439/83 |
| 5,139,448 A | * | 8/1992 | Seidler | 439/876 |
| 5,518,427 A | * | 5/1996 | Kan et al. | 439/736 |
| 5,571,033 A | | 11/1996 | Kinsey, Jr. et al. | 439/595 |
| 5,960,537 A | * | 10/1999 | Vicich et al. | 29/843 |
| 6,011,319 A | | 1/2000 | Kelly et al. | 439/76.2 |
| 6,012,223 A | | 1/2000 | Hinze | 29/837 |
| 6,062,916 A | | 5/2000 | Gladd et al. | 439/751 |
| 6,078,013 A | | 6/2000 | Stack | 174/262 |
| 6,081,996 A | | 7/2000 | Kruppa et al. | 439/83 |
| 6,179,631 B1 | | 1/2001 | Downes et al. | 439/83 |
| 6,220,876 B1 | | 4/2001 | Avila et al. | 439/76.2 |
| 6,413,119 B1 | | 7/2002 | Gabriski, Jr. et al. | 439/620 |
| 6,520,789 B1 | | 2/2003 | Daugherty, Jr. et al. | 439/329 |
| 6,535,396 B1 | | 3/2003 | Degenkolb et al. | 361/775 |

* cited by examiner

*Primary Examiner*—Hien Vu
(74) *Attorney, Agent, or Firm*—David P. Wood

(57) ABSTRACT

An electrical inter-connection is provided such that a terminal pin which is positioned in a pin block extends through a plated through-hole in a circuit board substrate and is connected with the circuit board using a conductive bonding agent such as solder. The terminal pin is capable of inter-connection with conductive elements located on each major side of the circuit board and eliminates the need for an interference fit between the terminal pin and circuit board. The pin block includes a body and at least one stand-off. The stand-off maintains the body a sufficient distance from the circuit board substrate to enable a solder fillet to form between the plated through-hole and the terminal pin during re-flow processing. The electrical inter-connection further includes an eccentric aperture in the circuit board suitable for interference fit inter-connection with a protruding cylindrical feature such as on an electrical ground that has poor solderability characteristics. The preferred embodiment limits normal forces caused by temperature cycling, vibration, and other conditions to two areas of contact yet enables adequately low electrical contact resistance.

3 Claims, 5 Drawing Sheets

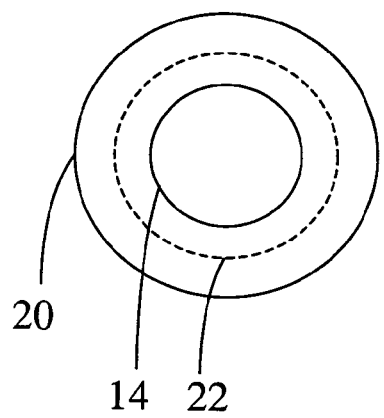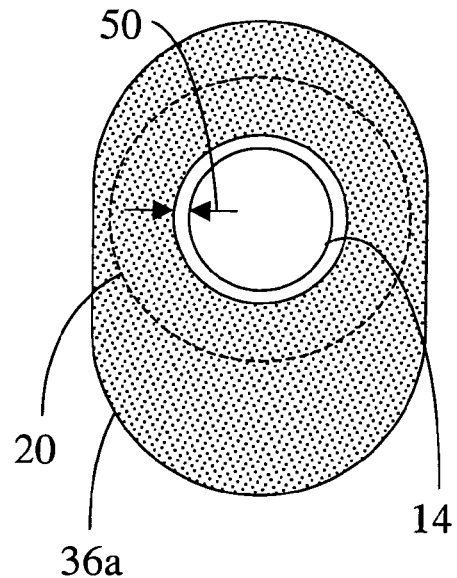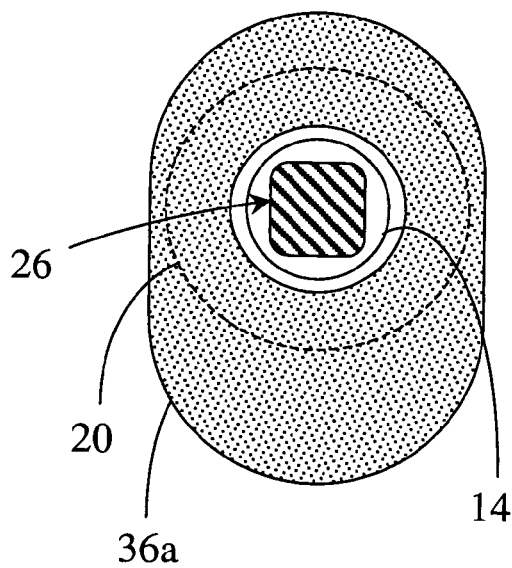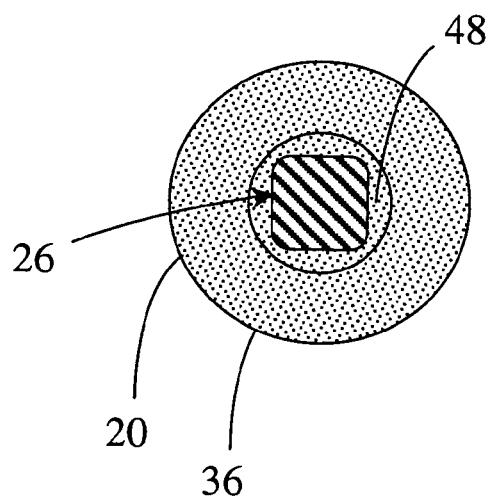
Fig. 4(a)   Fig. 4(b)
Fig. 4(c)   Fig. 4(d)

CIRCUIT BOARD INTER-CONNECTION SYSTEM AND METHOD

This application claims benefit of priority from U.S. provisional patent application Ser. No. 60/412,750, filed Sep. 23, 2002, which is hereby incorporated by reference.

BACKGROUND OF THE INVENTION

Technical Field

The present invention relates to systems and methods for providing electrical connections, and more particularly, to systems and methods for providing electrical connections with one or more electrical terminals and a circuit board.

BACKGROUND OF THE INVENTION

There is a growing need for electrical connections where conductive elements such as electrical connectors, circuit boards, and electronic modules located on each major side of a circuit board must be connected with each other and with the circuit board. U.S. Pat. No. 6,413,119, to Gabrisko, Jr. et al., which is incorporated herein for background purposes, discloses a filtered electrical connector, in which conductive pins (shown at 20) extend through a first circuit board (filter insert shown at 22) for connection with a mating connector on a first side and a second circuit board on a second side apposing the first side.

The above cited '119 patent discloses an electrical connection having a filter insert (shown at 22) comprising a plated thermoplastic substrate (generally shown at 48) which exhibits an-isotropic thermal expansion properties and includes electrical devices (such as capacitors shown at 64) connected with the filter insert. The major lengths of these electrical devices are oriented along a direction of reduced thermal expansion properties of the substrate. It should be noted that a terminal may be press-fit into a plated through-hole in a circuit board to produce this type of connection.

As packaging sizes and distances between centerlines continue to decrease, and as manufacturers seek to reduce costs, however, there is an increasing need for systems and methods for providing connections, whereby normal forces and stresses that are incurred during production (e.g., during insertion), which may cause damage or fatigue to, for example, circuit traces, solder joints, and electronic components. Stresses, such as those that may be created among a terminal and a circuit board, may also impose constraints on the designs of such devices, particularly when the devices and their connections are to be subjected to harsh environments, such as those found in vehicles (e.g., automobiles, aircraft, and the like), in heavy machinery or other high stress, shock-prone applications. Such design difficulties may also inhere in applications where size and/or weight is a significant factor (e.g., medical instruments). It should also be noted that cast contact pins in a connector housing may be force-fit into plated molded holes in the filter insert to establish good electrical contact for grounding the filter insert.

It should be noted that one advantage of such as a filtered insert substrate is that an-isotropic properties of the substrate material may be utilized to decrease the undesirable impacts (e.g., thermal expansion, stresses resulting from harsh environments) may impose on interference-fit connections (e.g., among one or more conductive pins and a circuit board, among one or more contact pins and a circuit board). Additionally, detailed features, such as holes configured for connection with electrical ground, may be molded into the material.

Despite these advantages, however, presently known approaches typically entail relatively high cost and complexity. For example, the requisite plating processes, the necessary use of an-isotropic thermoplastic materials, and their associated materials and tooling all typically contribute to increased complexity and cost.

It would therefore be beneficial to have a system and method that would enable use of low cost circuit board substrates, such as an FR-4 epoxy glass laminate having circuit traces and plated through-holes and produced through conventional plating processes, in applications whereby conductive elements located on a first major side of a circuit board may be inter-connected with the circuit board and with conductive elements located on a second major side of the circuit board. It would further beneficial to have a system and method that would provide electrical grounding of a circuit board, despite poor ground solderability characteristics, with reduced cost and increased reliability. It would further be desirable to have a system and method whereby such grounding, and any connections involved in such system and method, could be accomplished with significantly reduced, or eliminated, insertion forces, whereby normal forces and stresses that damage circuit traces, solder joints, and electronic components, might be reduced or eliminated.

SUMMARY OF THE INVENTION

The methods and apparatus of the present invention address many of the shortcomings of the prior art. In accordance with various aspects of the present invention, methods and systems provide improved electrical inter-connection among a circuit board and one or more conductive elements located on each major side of the circuit board, accommodating use of low-cost circuit board substrates while providing electrical grounding and significantly reducing or eliminating insertion forces and stresses that might otherwise damage circuit traces, solder joints, and electronic components.

In an exemplary embodiment of the present invention, an electrical inter-connection system comprises a circuit board substrate, a conductive pad, a conductive terminal, and a conductive bonding agent such as solder. The circuit board substrate has first and second surfaces and includes a through-hole extending between them. The conductive pad is disposed on the first surface, being positioned substantially adjacent the through-hole. The conductive terminal has first and second ends and extends through the through-hole such that its ends are exposed for electrical inter-connection with one or more mating elements, e.g., extending at least about 2 mm beyond the respective first and second surfaces of the circuit board substrate. Finally, the conductive bonding agent electrically connects the conductive terminal with the conductive pad.

In one exemplary embodiment, an electrical inter-connection system includes conductive plating in the through-hole and electrically connected with the conductive bonding agent. In another exemplary embodiment, a system includes a second conductive pad disposed on the second surface of the substrate, substantially adjacent the through-hole. In this embodiment, the conductive bonding agent also electrically connects the terminal with the second conductive pad.

In an exemplary embodiment, an electrical inter-connection system also includes a dielectric housing having a body and at least one stand-off. In accordance with this embodiment, the terminal is positioned in the housing, the stand-offs are mounted on the first surface, and the body is located a sufficient distance from the circuit board to enable a solder fillet to form between the conductive terminal and the conductive pad. The body may also have a board mounting face and an opposed mating face; the at least one stand-off may extend from the board mounting face; a first end of the terminal may extend outwardly from the board mounting face; a second end of the terminal may extend outwardly from the mating face; and the stand-off may engage the first surface of the substrate, providing a gap between the board mounting face and the first surface of the circuit board substrate.

In an exemplary embodiment, an electrical inter-connection system includes a circuit board substrate and a conductive body. In accordance with this embodiment, the circuit board substrate includes at least one aperture defined by a sidewall having a conductive surface. In addition, the conductive body has at least one protrusion extending from a base, the protrusion engaging two spaced-apart portions of the sidewall when the protrusion is inserted in the aperture, and the protrusion being seized within the aperture with an interference fit between the protrusion and the two spaced-apart portions, e.g., the protrusion having a draft angle between 1 and 3 degrees. The spaced-apart portions may comprise a flat surface, and the protrusion may have a generally cylindrical shape. The aperture may extend between the first and second surfaces and may have an eccentric shape or may be shaped as a slot having a length and a width, e.g., the difference between said slot width and the protrusion diameter being between 1.5% and 20% of the slot width. Optionally, the conductive pads may occupy a portion of the periphery of the through-hole or may be substantially annular in shape, surrounding the through-hole on one or more sides of the circuit board.

In another illustrative embodiment of the invention, an electrical inter-connection system comprises a pin block that holds at least one conductive pin. The pin block includes at least one stand-off feature that provides a gap between a body portion of the pin block and the circuit board so that solder screened onto one surface of the circuit board substrate can flow into the plated through-hole during re-flow processing. The gap further provides space for a solder fillet to form between the conductive pin and a conductive pad during processing.

In yet another exemplary embodiment, an electrical inter-connection system comprises a circuit board having an eccentric aperture suitable for connection with a protruding cylindrical feature on an electrical ground, such as a die cast aluminum housing, which may not be suitable for soldering, i.e., which exhibits poor solderability. In accordance with this embodiment, the eccentric aperture is plated with a conductive material, which is electrically connected with circuitry on the circuit board. Accordingly, when the circuit board is pressed onto the protruding cylindrical feature, electrical connection is established among the circuit board and the electrical ground due to the interference contact between the protrusion and the plated conductive material on the aperture, thereby optimizing normal forces acting upon the grounding inter-connection so as to provide adequately low, electrical contact resistance with reduced net stresses.

In a further aspect, the invention provides an improved method for producing an electrical inter-connection among a circuit board and one or more conductive elements located on the major sides of the circuit board. In accordance with various embodiments, the invention enables a conductive terminal to be inserted into a through-hole in a circuit board and electrically connected with the circuit board without requiring an interference fit. Accordingly, the invention facilitates low-cost, high volume production involving filtered electrical connectors.

In an exemplary embodiment, a circuit board inter-connection method enables a conductive terminal to be electrically connected with a circuit board having a plated through-hole. In an exemplary embodiment, a conductive pin or terminal suitable for connecting a circuit board with conductive elements on each major side of the circuit board is inserted into a through-hole and electrically, and optionally, mechanically connected with the circuit board using a single re-flow process. In an exemplary re-flow process, solder paste or another conductive bonding agent is applied to one or more side of the circuit board and processed through a re-flow oven one or more time to establish the connection among the circuit board and the terminal.

In an exemplary embodiment, a circuit board inter-connection method is provided for forming an electrical connection in a through-hole defined in a circuit board substrate. In accordance with this embodiment, a method includes providing a circuit board substrate having first and second surfaces and a through-hole extending between the first and second surfaces; providing a conductive terminal having first and second ends; providing a first conductive pad on the first surface of the circuit board substantially adjacent the through-hole; placing a conductive bonding agent on the first conductive pad; placing the terminal into the through-hole such that the first end is exposed for electrical connection with a mating element on the first side of the circuit board, and the second end is exposed for electrical connection with a mating element on the second side of the circuit board; and re-flowing the conductive bonding agent, causing it to flow into the through-hole so that it electrically connects the terminal with the first conductive pad.

In another exemplary embodiment, a circuit board inter-connection method includes the step of providing a second conductive pad on the second surface of the circuit board, substantially adjacent the through-hole and the step of causing the bonding agent to flow includes causing the conductive bonding agent to flow through the through-hole such that the conductive bonding agent electrically connects said terminal with the second conductive pad.

In another exemplary embodiment, a circuit board inter-connection method includes the step of placing a stencil over the through-hole before placing a conductive bonding agent on the first conductive pad, whereby the conductive bonding agent is prevented from being placed in the through-hole. The method may comprise the step of removing the stencil before placing the terminal into the through-hole.

In another exemplary embodiment, a circuit board inter-connection method includes providing a pin block, the pin block comprising a dielectric housing having a body and at least one stand-off, the body having a board mounting face and an opposed mating face, and the at least one stand-off extending from the board mounting face. The method may also include the step of positioning the terminal in the pin block such that the first end extends through the body between the board mounting face and the mating face. The step of placing the terminal into the through-hole may include placing the at least one stand-off on the first surface of the circuit board substrate, and the body may be located a sufficient distance from the circuit board to enable a solder fillet to form between the conductive terminal and the first conductive pad.

These and other features and advantages of the present invention will become apparent from the following brief description of the drawings, detailed description, and appended drawings.

BRIEF DESCRIPTION OF THE DRAWINGS

The above-mentioned objects and features of the present invention can be more clearly understood from the following detailed description considered in conjunction with the following drawings, in which like numerals represent like elements and in which:

FIGS. 4(a)–4(d) illustrate top plan views showing the steps of a method in accordance with an exemplary embodiment of the present invention;

DETAILED DESCRIPTION OF THE INVENTION

As discussed above, the methods and systems of the present invention provide improved electrical inter-connection among a circuit board and one or more conductive elements located on each major side of the circuit board, accommodating use of low-cost circuit board substrates while providing electrical grounding and significantly reducing or eliminating insertion forces and stresses that might otherwise damage circuit traces, solder joints, and electronic components.

Figure 1:
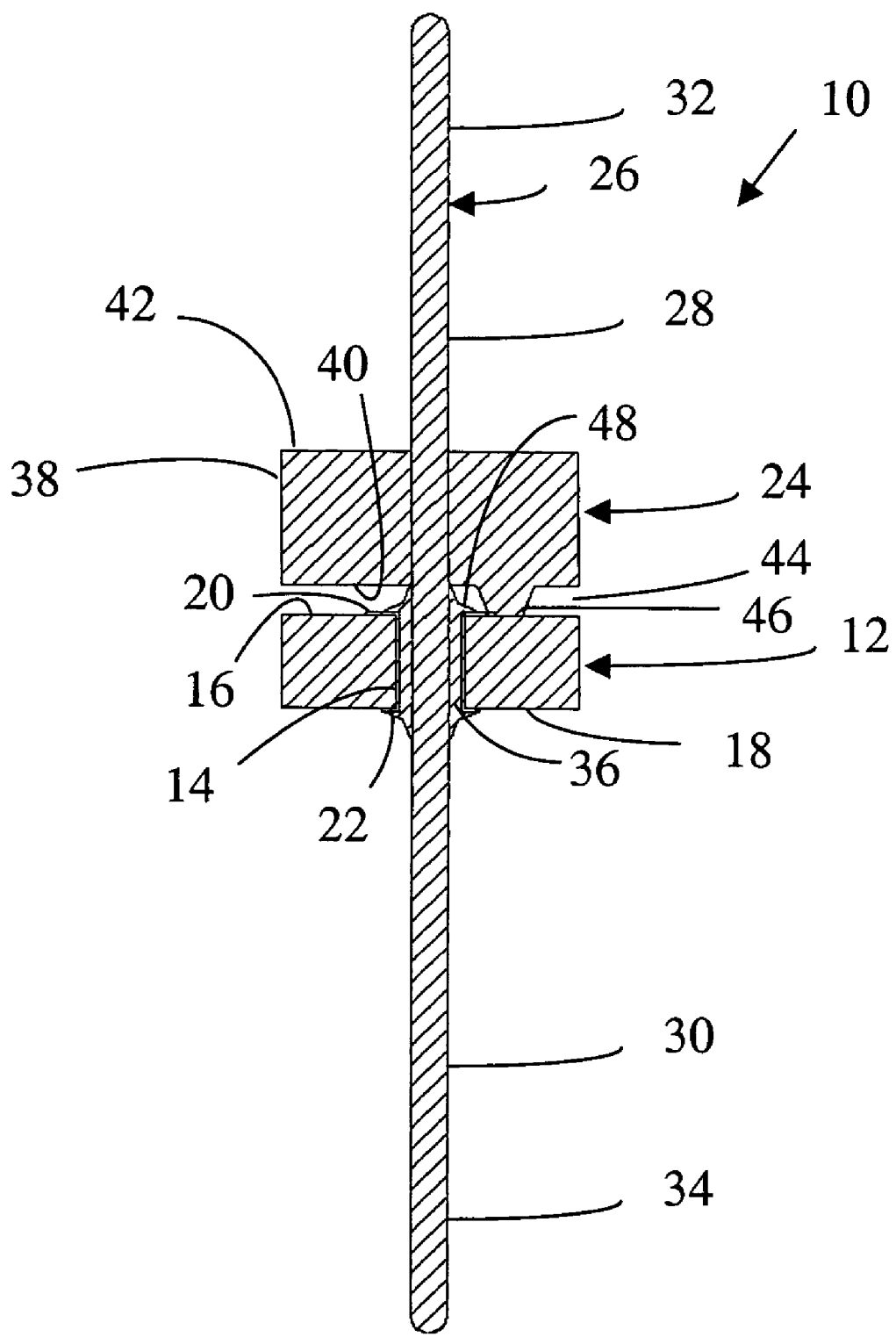
FIG. 1 illustrates a sectional view of an inter-connection system in accordance with an exemplary embodiment of the present invention.

Referring to the figures, FIG. 1 illustrates an exemplary embodiment of a first aspect 10 of the electrical inter-connection system of the present invention. First aspect 10 includes a circuit board 12 having a plated through-hole 14 extending between first and second surfaces 16, 18 of circuit board 12, an annular first conductive pad 20 disposed on first surface 16 surrounding and substantially adjacent plated through-hole 14, and an annular second conductive pad 22 disposed on second surface 18 surrounding and substantially adjacent plated through-hole 14. Circuit board 12 is made of a standard FR-4 epoxy-glass material. It should be noted that other circuit board materials such as polymide-glass, benzocyclobutene, Teflon, other epoxy resins, injection molded plastic, ceramic, or the like may also be used as may other suitable circuit board materials known to those skilled in the art.

A pin block 24 is positioned on first surface 16 of circuit board 12. Conductive pin 26 or terminal is positioned in pin block 24 and extends through plated through-hole 14. Conductive pin 26 has first and second ends 28, 30, each end 28, 30 including a respective exposed protruding portion 32, 34 for connection with a mating element (not shown), such as a female terminal or a through-hole in a second circuit board. The exposed protruding portions 32, 34 each extend at least about 2 mm beyond respective first and second surfaces 16, 18 of circuit board 12 and further extend a sufficient distance, as necessary, to mate with a selected mating element. Solder 36 electrically connects the conductive pin 26 with first and second conductive pads 20, 22. It should be noted that other conductive bonding agents such as conductive epoxy may also be used. Pin block 24 includes a body 38 having a board mounting face 40 and an opposed mating face 42 and at least one integral stand-off feature 46 extending from board mounting face 40 that provides a gap 44 between body 38 and circuit board 12. Gap 44 between body 38 and circuit board 12 provides space for solder paste 36a (as shown on FIGS. 4b and 4c), which is applied to first surface 16 of circuit board 12 to flow into plated through-hole 14 during re-flow processing. Gap 44 further provides space for a solder fillet 48 to form between conductive pin 26 and first conductive pad 20.

Figure 2:
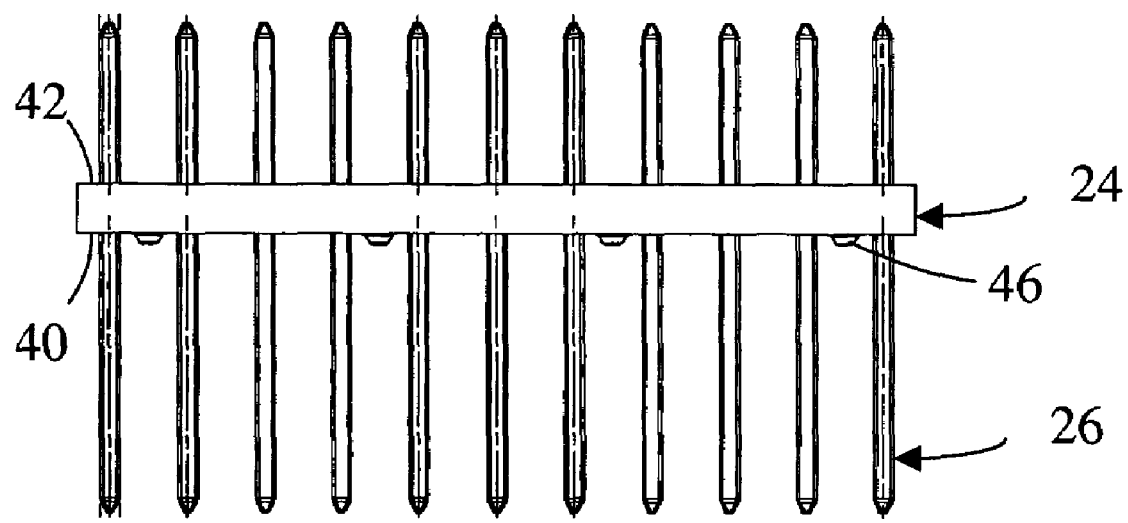
FIG. 2 illustrates a side view of a pin block and terminal in accordance with an exemplary embodiment of the present invention.
Figure 3:
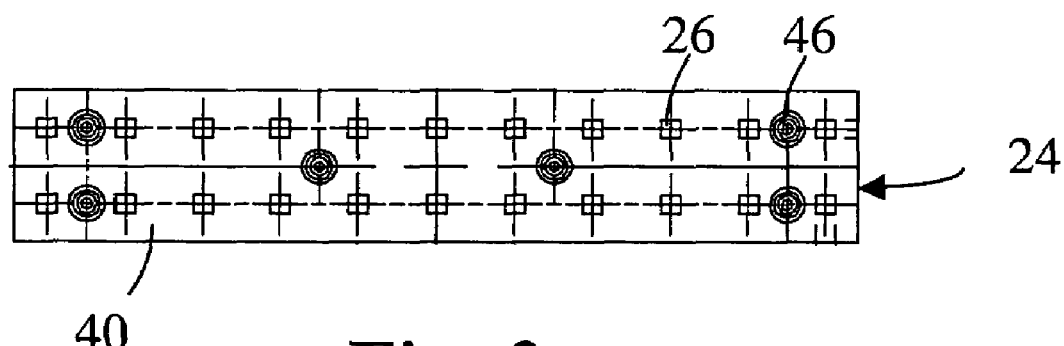
FIG. 3 illustrates a bottom plan view of a pin block and terminal in accordance with an exemplary embodiment of the present invention.

As shown on FIGS. 2 and 3, an exemplary embodiment of pin block 24 of the present invention includes a plurality of spaced conductive pins 26. Conductive pins 26 may be held in place by slip fit, one or more interference feature formed in the body of the pin, an insert-molding process, or any other suitable mechanism. Pin block 24 is molded of a dielectric material, preferably plastic, with a plurality of stand-off features 46, which provide gap 44 between body 38 of pin block 24 and first surface 16 of circuit board 12. Stand-off features 46 are located based on desired circuit board 12 geometry and pin 26 array configuration to minimize contact with first conductive pad 20 and other areas where solder paste 36a is screened onto circuit board 12. As shown on FIG. 1, stand-off feature 46 is designed to minimize surface area contact by tapering to a small geometric shape, such as a circle or rectangle from body 38 of pin block 24. This taper also serves to aid mold release when plastic pin block 24 is manufactured. It is important that these features, as part of pin block 24, be made of a material that will withstand processing temperatures, such as those in a typical solder re-flow process.

FIGS. 4(a)–4(d) and FIG. 5 illustrate an exemplary method 100 of manufacture according to the present invention. Referring first to FIG. 4(a), the circuit board (as shown on FIG. 1) is provided with plated through-hole 14. Annular first conductive pad 20 is disposed on first surface 16 (as shown on FIG. 1) surrounding and substantially adjacent plated through-hole 14, and annular second conductive pad 22 is disposed on second surface 18 (as shown on FIG. 1) surrounding and substantially adjacent plated through-hole 14.

As shown on FIG. 4(b), a layer of a solder paste 36a is applied to first conductive pad 20 using a screening process. Other conductive bonding agents and application processes known to those skilled in the art may also be used. Pin an exemplary embodiment, a stencil is utilized during this step to mask the area over and around plated through-hole 14 to keep solder paste 36a away from plated through-hole 14. Thus, a space 50 is provided between layer of solder 36 and plated through-hole 14, enabling conductive pin 26 to be inserted without contacting solder paste 36a. This is important because, if solder paste 36a adheres to conductive pin 26, it may cause normal forces to increase during subsequent mating operations, creating a less aesthetically appealing product. In a separate step (not shown), conductive pin 26 is positioned in pin block 24.

As shown on FIG. 4(c), conductive pin 26 is placed in plated through-hole 14 such that pin block 24 is seated on first surface of circuit board 12 (as shown on FIG. 1) and each of first and second ends 28, 30 of conductive pin 26 project beyond respective first and second surfaces 16, 18 of circuit board 12 (as shown on FIG. 1). Conductive pin 26 is held in place by pin block 24 (as shown on FIG. 1), by a fixture (not shown), or another method within the scope of the present invention.

Solder paste 36a may be re-flowed in a conventional re-flow process, which melts solder paste 36a. Melted solder 36 is drawn toward conductive pin 26, forming solder fillet 48 between conductive pin 26 and first conductive pad 20. FIG. 4(*d*) and FIG. 1 illustrate conductive pin 26, solder 36, and first conductive pad 20 after solder paste 36a has been re-flowed.

Figure 5:
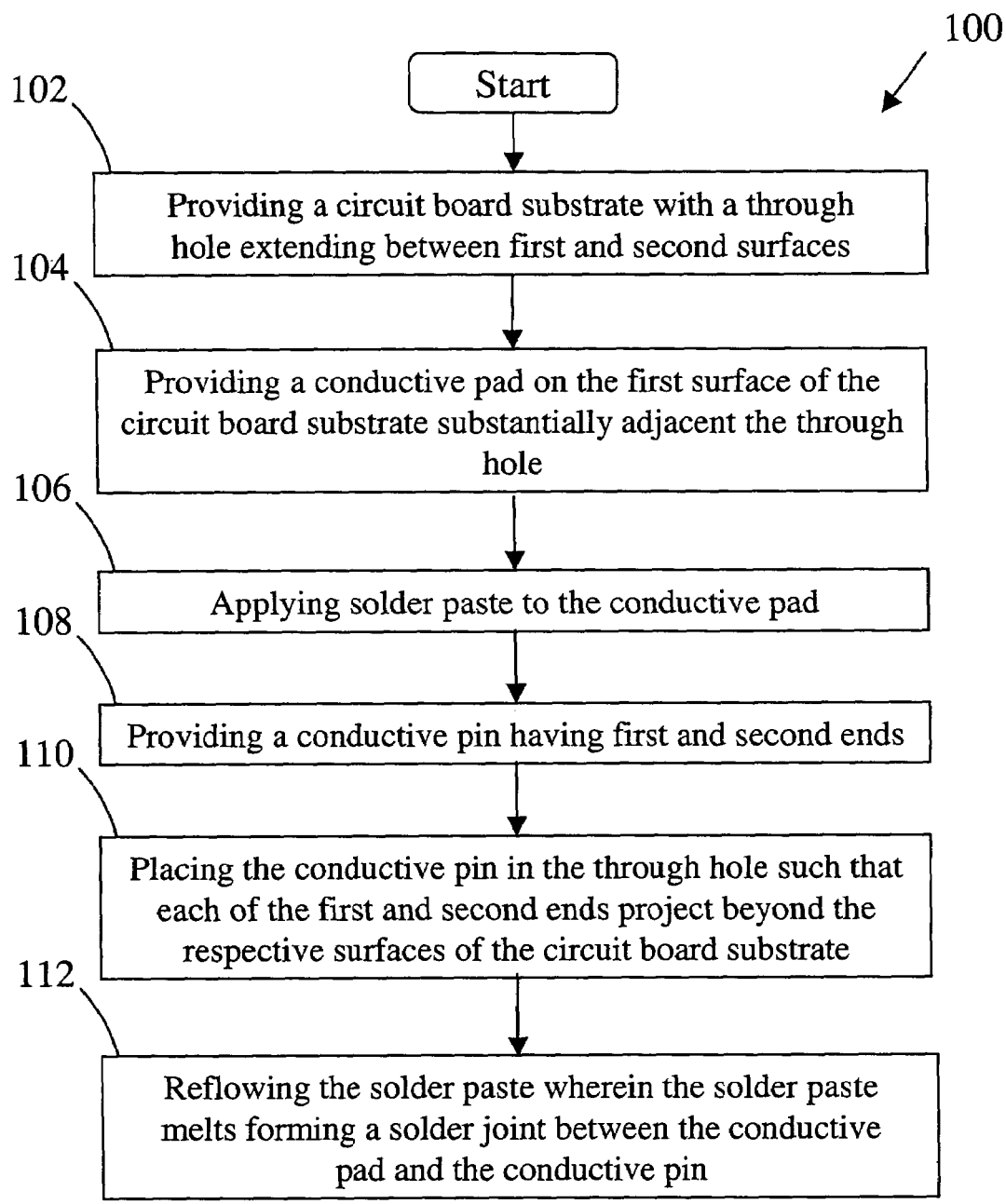
FIG. 5 illustrates a flow chart of a method in accordance with an exemplary embodiment of the present invention.

Referring now to FIG. 5, an exemplary method 100 includes the steps of:

providing a circuit board substrate with a through-hole extending between first and second surfaces 102, wherein through-hole includes conductive plating extending between first and second surfaces;

providing a first conductive pad on the first surface of circuit board substrate substantially adjacent through-hole 104;

providing a second conductive pad on second surface of circuit board substrate substantially adjacent plated through-hole (not shown on FIG. 5);

providing a stencil on first surface of circuit board to mask through-hole and a small annular area immediately surrounding through-hole (not shown on FIG. 5);

applying sufficient solder paste to first conductive pad to form a robust solder joint 106, preferably utilizing stencil or another mechanism to prevent solder paste from being placed in through-hole;

removing stencil (not shown on FIG. 5);

providing a conductive pin or terminal having first and second ends 108;

providing a pin block having a dielectric housing including a body and at least one stand-off, the body having a board mounting face and an opposed mating face, the at least one stand-off being capable of providing a gap for solder to flow and for a solder fillet to form between the conductive pin and the first conductive pad when the pin block is connected with the circuit board (not shown on FIG. 5);

positioning the conductive pin in the pin block such that first end extends through body between board mounting face and mating face (not shown on FIG. 5);

placing the conductive pin in through-hole such that each of first and second ends project beyond respective first and second surfaces of circuit board substrate 110, when pin block is utilized, this step further includes placing at least one stand-off on first surface of circuit board substrate, thereby leaving sufficient gap between body of pin block and first surface of circuit board for solder to flow and for solder fillet to form between conductive pin and first conductive pad; and re-flowing solder paste by heating or other methods known to those skilled in the art so that solder paste melts and flows into through-hole, forming solder joint between first conductive pad and conductive pin 112 and, optionally, between second conductive pad and conductive pin when second conductive pad is provided on second surface of circuit board.

This method is particularly advantageous when the opposing side of the circuit board is densely populated with components, thereby leaving little or no room to apply the conductive bonding agent to the opposing side. As discussed above, in an exemplary embodiment of the method, a stencil is placed over and around plated through-hole before conductive bonding agent is applied to circuit board to keep conductive bonding agent away from plated through-hole. This enables the terminal to be inserted into the plated through-hole without contacting conductive bonding agent, which, if it adheres to terminal, causes normal forces to increase during subsequent mating operations and creates an aesthetically unappealing product. Importantly, the invention enables an electrical and mechanical connection to be established without the need for an interference fit, which might otherwise causes stresses, fatigue, and/or damage to circuit traces, solder joints, and electronic components.

The embodiment of the method as shown on FIGS. 4(*a*)–4(*d*) and FIG. 5 and as described above is provided merely by way of example and is not intended to limit the scope of the invention in any way. All steps are not required in all applications. Other modifications may occur to one skilled in the art. For example, solder may be replaced by other conductive bonding agents known to those skilled in the art. Furthermore, it is not necessary to use a pin block in all applications. Nor is it necessary that the through-hole be plated or that the second conductive pad be placed on the second side of the circuit board, particularly when it is not necessary to provide electrical connection with circuitry on the second side of the circuit board. Nor is it necessary that a stencil be used during the step of applying the solder paste.

Figure 6:
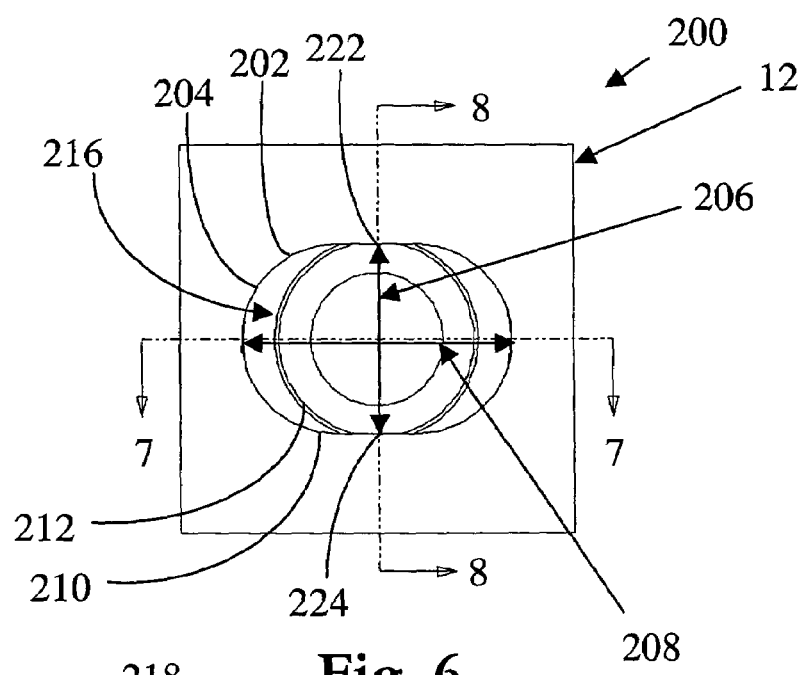
FIG. 6 illustrates a top plan view of a second aspect of an inter-connection in accordance with an exemplary embodiment of the present invention.
Figure 7:
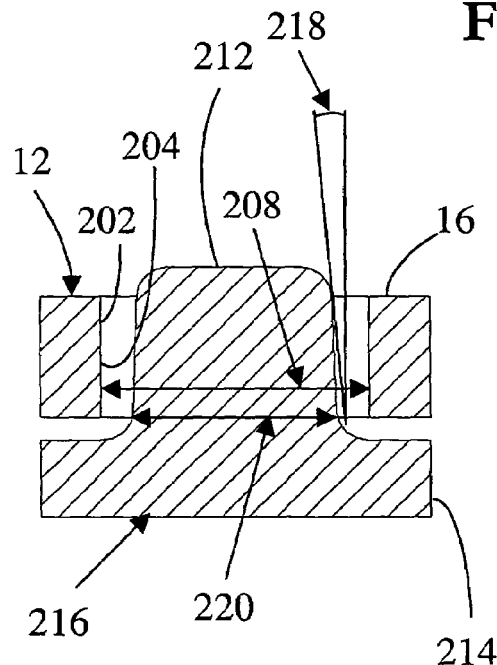
FIG. 7 illustrates a view taken along line 7—7 of FIG. 6.
Figure 8:
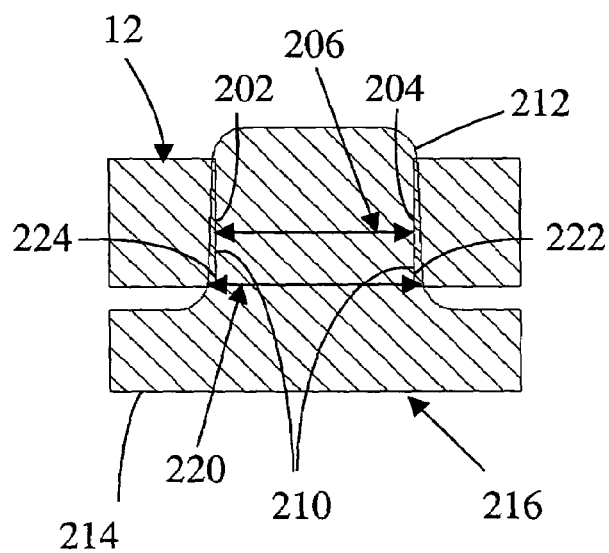
FIG. 8 illustrates a view taken along line 8—8 of FIG. 6.

FIGS. 6–8 illustrate a second aspect 200 of the present invention. In an exemplary embodiment, second aspect 200 is suitable for providing an interference fit electrical connection among a circuit board and a ground having poor solderability characteristics. This embodiment optimizes normal forces, for lower stresses, yet enables adequately low electrical contact resistance, such as 10 milliohms, or less in one embodiment.

In the second aspect 200, the circuit board 12 has an eccentric aperture 202 defined by a sidewall 204. Aperture 202 has a narrow portion 206 and a wide portion 208. Sidewall 204 has a conductive plating 210, for example, tin/lead over copper, which is connected with circuitry on circuit board 12. Second aspect 200 further includes a protruding cylindrical feature 212 extending from a base 214 on an electrical ground 216. It should be noted that ground 216 may have poor solderability characteristics, such as when a die cast aluminum housing is used as a ground. Circuit board 12 is pressed onto protruding cylindrical feature 212, such that protruding cylindrical feature 212 extends into eccentric aperture 202, establishing an electrical connection among circuit board 12 and electrical ground 216 due to the interference contact between protruding cylindrical feature 212 and plated conductive material 210 in aperture 202.

In an exemplary embodiment, cylindrical feature 212 has a 1 to 3 degree draft angle 218, and the difference between diameter 220 of cylindrical feature 212 as measured at base 214 and aperture 202 width at narrow portion 206 is about 1.5% to 20% of aperture 202 width. This configuration enables circuit board 12 to seize protruding cylindrical feature 212 at two spaced-apart opposing portions 222, 224 of sidewall 204 upon inserting protruding cylindrical feature 212 into aperture 202, and once inserted, protruding cylindrical feature 212 is seized within aperture 202 at solely opposing portions 222, 224 with an interference fit between protruding cylindrical feature 212 and opposing portions 222, 224. Further, the length as measured at wide portion 208 is generally at least 34% larger than the width as measured at narrow portion 206 to prevent circuit board 12 from seizing protruding cylindrical feature 212 at more than two points.

The preferred embodiments shown and described herein are provided merely by way of example and are not intended to limit the scope of the invention in any way. Preferred dimensions, ratios, materials and construction techniques are illustrative only and are not necessarily required to practice the invention. It is intended that the scope of the present invention herein disclosed should not be limited by the particular disclosed embodiments herein, but should be defined only by a fair reading of the claims that follow.

Further modifications and alterations may occur to others upon reading and understanding the specification. For example, the circuit board 12 may include a plurality of spaced eccentric apertures 202 to mate with a body, such as ground 216, having a plurality of corresponding protrusions 212 to provide a mechanical and/or electrical connection. It is intended to include all such modifications and alterations insofar as they come within the scope of the invention.

Having thus described the invention, what is claimed is:

1. A method of forming an electrical connection in through-holes defined in a circuit board substrate, comprising:
   providing a circuit board substrate having first and second surfaces and through-holes extending between said first and second surfaces;
   providing a pin block, said pin block comprising a dielectric housing having a body and at least one stand-off, said body having a board mounting face and an opposed mating face, said at least one stand-off extending from said board mounting face;
   providing conductive terminals, each having first and second ends, each of the terminals being positioned in said pin block such that said first and end extends through said body between said board mounting face and said mating face;
   providing first conductive pads on sad first surface of said circuit board substantially adjacent said through-holes;
   placing solder paste on said first conductive pads spaced apart from the through-holes;
   assembling said pin block and said terminals to said circuit board substrate, such that each of said terminals is placed into one of said through-holes such that said first end is exposed for electrical connection with a mating element on said first side of said circuit board and said second end is exposed for electrical connection with a mating element on said second side of said circuit board, and further such that said board mounting face of said pin block faces the first surface of the printed circuit board and said at least one stand-off placed between the terminals and against said first surface of said circuit board substrate to locate said pin block a sufficient distance from said circuit board to enable a solder fillet to form between said conductive terminal and said first conductive pad; and
   re-flowing said solder paste to flow solder into said through-holes and form solder fillets that electrically connect said terminals with said first conductive pads;
   the method further comprises the step of placing a stencil over said through-holes prior to said step of placing solder paste on said first conductive pads to prevent said solder paste from being placed in said through-holes and said method further comprises the step of removing said stencil prior to said step of placing said terminals into said through-holes.

2. A method as recited in claim 1, further comprising the step of providing second conductive pads on said second surface of said circuit board substantially adjacent said through-holes;
   wherein said step of causing said solder paste to flow further includes causing said solder fillets to flow through said through-holes such that said fillets electrically connect said terminals with said second conductive pads.

3. A method as recited in claim 1, wherein each of said through-holes includes a plating extending between said first and second surfaces of said circuit board.

* * * * *